United States Patent [19]

Ingram

[11] Patent Number: 5,046,126
[45] Date of Patent: Sep. 3, 1991

[54] FAST SETTLING TONE/DATA PROCESSING CIRCUIT FOR A RADIO RECEIVER

[75] Inventor: Norbert D. Ingram, Lynchburg, Va.

[73] Assignee: Ericsson GE Mobile Communications Inc., Lynchburg, Va.

[21] Appl. No.: 453,074

[22] Filed: Dec. 19, 1989

Related U.S. Application Data

[63] Continuation of Ser. No. 236,369, Aug. 25, 1988, abandoned.

[51] Int. Cl.⁵ .............................................. H04B 1/16
[52] U.S. Cl. ...................................... 455/35; 455/343; 455/221; 455/223
[58] Field of Search ................. 455/35, 213, 214, 218, 455/220, 221, 223, 174, 194, 343, 338, 57; 340/825.48

[56] References Cited

U.S. PATENT DOCUMENTS

| | | | |
|---|---|---|---|
| 3,681,698 | 8/1972 | McEvoy | 455/161 |
| 3,961,268 | 6/1976 | Hansen | 455/223 |
| 4,481,675 | 11/1984 | Ichi Kawa et al. | 455/343 |
| 4,617,590 | 10/1986 | Dann | 358/34 |
| 4,627,101 | 12/1986 | Anderson et al. | 455/194 |
| 4,658,198 | 4/1987 | Thurber, Jr. | 341/155 |
| 4,731,868 | 3/1988 | Dreier | 455/161 |

Primary Examiner—Douglas W. Olms
Assistant Examiner—Ralph Smith
Attorney, Agent, or Firm—Nixon & Vanderhye

[57] ABSTRACT

In a radio employing continuous tone or digital coded squelch system, fast settling tone processing circuitry is disclosed for a tone processing path which includes an FM detector, low pass filters and a tone limiter. In an exemplary embodiment, a capacitor at the output of the FM detector in the tone/data processing path is charged as rapidly as possible to a new DC level, for example, by an off frequency transmitter. A pulse is generated by, for example, the transceiver microprocessor which initiates the rapid charging of the capacitor as soon as it is detected that data needs to be read from the tone/digital data processing circuitry for decoding. Such a pulse is generated by the microprocessor whenever channel frequencies are changed and/or the carrier activity sensor becomes active.

47 Claims, 4 Drawing Sheets

RECEIVER TONE / DATA PROCESSING PATH

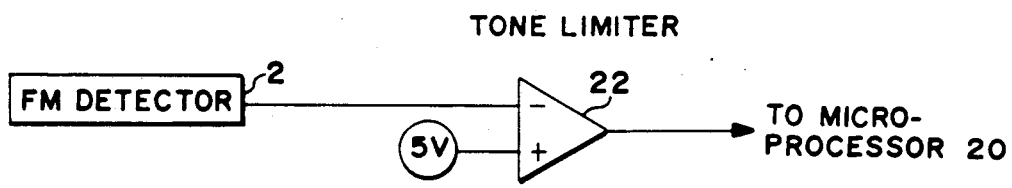
FIG. 3a
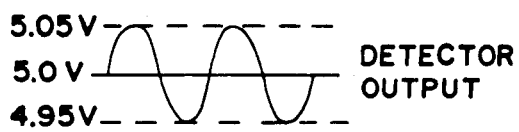
FIG. 3b
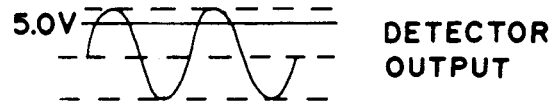
FIG. 3d
FIG. 3c
FIG. 3e
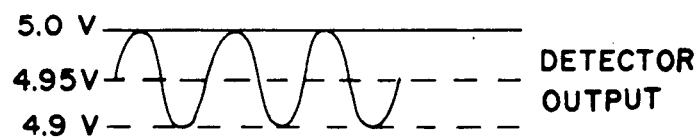
FIG. 3f
FIG. 3g

FAST SETTLING TONE/DATA PROCESSING CIRCUIT FOR A RADIO RECEIVER This is a continuation of application Ser. No. 236,369, filed Aug. 25, 1988, now abandoned.

FIELD OF THE INVENTION

This invention generally relates to a digitally controlled radio communications device. More particularly, the invention relates to a method and apparatus which allows rapid scanning of multiple channel frequencies in search of a predetermined tone or data pattern by reducing the settling time of the radio receiver's tone/data processing circuitry.

BACKGROUND AND SUMMARY OF THE INVENTION

Mobile and/or portable radio transceiving devices have heretofore incorporated a "channel guard" coding option which permits an operator to selectively call desired parties by transmitting a low frequency tone or digital data pattern. Such a "channel guard" coding option is also referred to as a continuous tone coded squelch system (CTCSS) or a continuous digital coded squelch system (CDCSS). Channel guard provides a means of restricting calls to specific radios. Only the desired parties' receivers are programmed to decode the transmitted tone or digital data pattern.

By using the channel guard option, many users can share a repeater system, with only the receivers programmed to receive the particular transmitted channel guard coded tone being enabled to receive a transmitted message. The transmitted tones in a tone channel guard system may, for example, range from 67 Hz to 210.7 Hz in 0.1 Hz steps. In a digital channel guard system, there may be over 80 standard digital codes. The frequency of transmitted digital channel guard signals is typically significantly lower than in tone channel guard systems.

The tones or digital codes frequency modulate the transmitted RF carrier at typically ±0.75 kHz deviation. The specification tolerance is 0.5 to 1.0 kHz deviation. Voice signals frequency modulate the carrier at ±3.75 kHz deviation. Therefore, the total channel deviation is 3.75 plus 0.75 or 4.5 kHz deviation which is within the FCC's 5 kHz maximum limit.

Systems incorporating such tone or data channel guard features include tone or data processing circuitry for processing and decoding the received tones or digital data to detect the proper tone or data sequence. To process such low frequency tones or digital data to correctly detect predetermined tone or data patterns, it is necessary for the RC time constant in the tone processing circuitry to be long enough to preserve the tone or data signal pattern for reliable decoding of noisy signals. In a digital channel guard system, a digital pattern may consist of a lengthy string of logic "1's" or "0's".

In conventional radios incorporating such a channel guard feature, when a receiver detects a carrier in the channel guard mode, it attempts to decode a channel guard tone pattern. In such prior art radios, if the proper channel guard is not detected, the receiver audio is simply muted.

The time required to decode a channel guard tone pattern was not heretofore considered an important limitation in previous designs of tone/data processing circuits. In this regard, a hundred millisecond or more settling delay was not viewed as presenting any significant operating problems.

The present invention, by reducing this settling delay to a minimum, permits scanning multiple channel frequencies to search for the correct channel guard tones or data. In the channel guard operating mode, when a RF carrier is detected, the tone or data processing circuitry of the present invention, rapidly begins to produce tones and digital data which may be reliably decoded by the transceiver microprocessor. If an "incorrect" channel guard pattern is detected, the channel scanning process continues immediately. The present invention allows low frequency data to be sensed as fast as possible while scanning different channel frequencies.

In simultaneously implementing both channel scanning and channel guard features, the present invention recognizes that a problem inhibiting fast scanning of multiple channel frequencies results from the failure of a transmitter to be precisely on frequency with the receiver. In this regard, it is noted that the output of a FM detector with no RF carrier present, consists of noise at an average DC level. If the transmitter is on frequency with the receiver, when an on frequency carrier is detected, the DC level at the output of the FM detector will not shift. Thus, the DC level at the output of the FM detector remains relatively constant when an on frequency carrier appears.

However, if the receiver and transmitter differ by, for example, 0.5 kilohertz in frequency, the DC level at the output of the FM detector will shift. This shift in DC level creates a pulse which is detected by the tone or data processing circuitry which will be misinterpreted as valid data by the processing circuitry until the RC networks therein charge to the new DC level. Since under such circumstances it may take the RC networks in the tone processing circuitry approximately 100 milliseconds to charge to the new DC level, data detected during this "settling" time period may be erroneously interpreted as a part of a tone or data channel guard pattern.

If a receiver and transmitter differ by, for example, 2 kilohertz or more, even longer settling times are required before the tone or data processing circuitry will, in fact, produce valid, reliable channel guard data. Since tone signals or digital data typically frequency modulate an RF carrier at a minimum of plus or minus 0.5 kHz deviation, such a deviation creates a significant impediment to implementing the rapid scanning of multiple channel frequencies while employing the channel guard feature described above.

In an exemplary embodiment of the present invention, a capacitor at the output of the FM detector in the tone/data processing path is charged as rapidly as possible to a new DC level caused, for example, by an off frequency transmitter. In the present invention, a pulse is generated by, for example, the transceiver microprocessor which initiates the rapid charging of the capacitor as soon as it is detected that data needs to be read from the tone/digital data processing circuitry for decoding. Such a pulse may be initiated by the microprocessor whenever channel frequencies are changed and/or the carrier activity sensor becomes active.

BRIEF DESCRIPTION OF THE DRAWINGS

These as well as other objects and advantages of this invention will be better appreciated by reading the following detailed description of the presently preferred exemplary embodiments taken in conjunction with the accompanying drawings of which:

FIG. 3a shows a simplified version of the processing path including a simplified tone limiter circuit;

FIGS. 3b-3g show the detector and tone limiter output for exemplary on-frequency and off-frequency RF carriers;

DETAILED DESCRIPTION OF THE DRAWINGS

Figure 1:
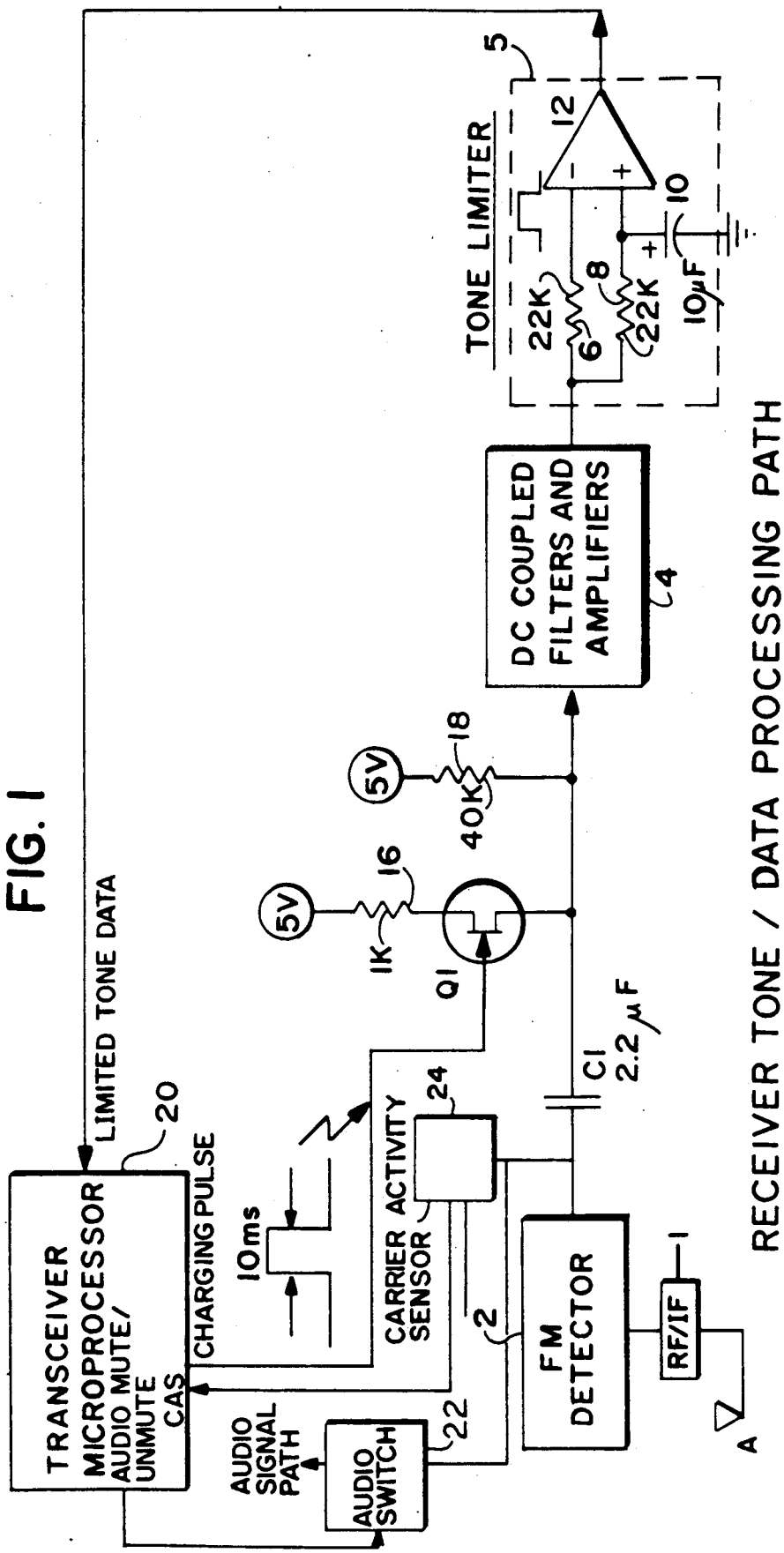
FIG. 1 is a schematic block diagram of a radio receiver having tone/data processing circuitry in accordance with an exemplary embodiment of the present invention.

FIG. 1 shows a block diagram of a radio receiver having a channel guard tone or data processing path in accordance with an exemplary embodiment of the present invention fed by the output of a conventional FM receiver detector 2. It is emphasized that the specific component values and bias potentials shown in FIG. 1 are exemplary only and should not be construed as limiting the scope of the present invention.

Figure 2A:
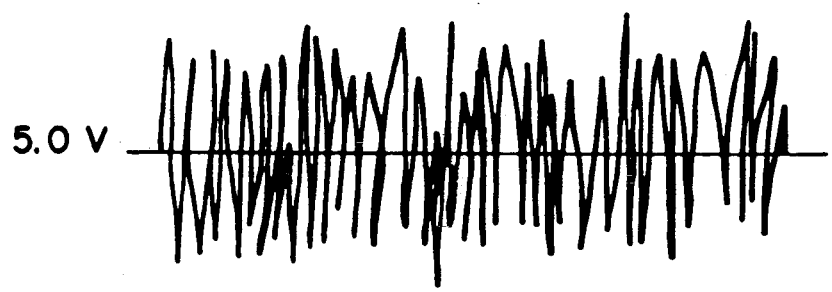
FIGS. 2a-2c respectively show the FM detector output with no RF signal, the FM detector output with an on-frequency RF carrier, and the FM detector output with the RF carrier 1 kHz off-frequency.

The purpose of the FM detector 2 is to recover the frequency modulated audio or data information on a RF carrier. The detector 2 converts the frequency variations of the RF carrier received from an antenna A and a conventional radio receiver RF/IF subsystem 1 to amplitude variations. The output of a FM detector with no carrier present consists of noise at an average dc level. Assume this level is 5.0 Vdc as shown in FIG. 2a.

Figure 2B:
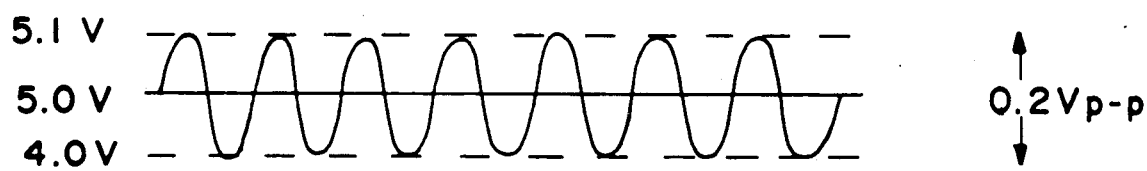
Figure 2C:
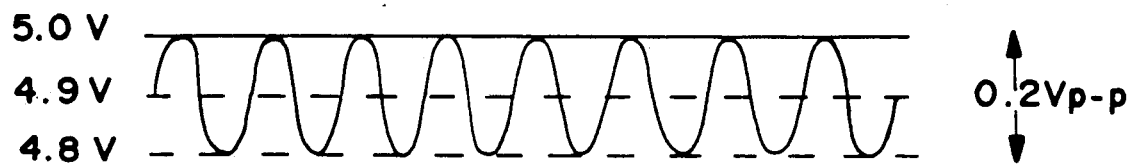

Normally, this dc level remains relatively constant when an on-frequency carrier appears. If we assume that the FM detector 2 outputs swings 0.1 volts per 1.0 kHz frequency change, then as shown in FIG. 2b, a RF carrier frequency modulated with a tone at ±1.0 kHz deviation produces a 0.2 volt peak-to-peak output signal. However, if the received carrier is 1 kHz off frequency, the average dc level will shift 0.1 Vdc. As shown in FIG. 2c, the dc level is shifted low.

The output of the FM detector 2 is coupled to conventional DC coupled filters and amplifiers 4 via a DC blocking capacitor C1. It is noted that the channel guard tone signaling described above, is accomplished with signals of a frequency no higher than approximately 210 Hz. The DC coupled filters in block 4 are low pass filters, which pass frequencies below, for example, 220 Hz, but which significantly attenuate voice and noise signals above 220 Hz to insure that such signals do not affect the tone limiter operation.

DC coupled filters and amplifiers 4 are in turn coupled to tone limiter 5 which serves to convert, for example, sine wave tone signals into a square wave pulse train. The generated square wave pulse train is decoded by the transceiver microprocessor 20 which recognizes a predetermined tone pattern (or pattern of digital data) and thereafter closes the audio signal paths in the transceiver (not shown) to unmute the audio to allow the audio signals to be received on a predetermined channel.

The DC coupled filters in block 4 also serve to couple a DC bias potential via resistor 18 to the tone limiter 5. For example, the DC coupled filters and amplifiers 4, and the tone limiter 5 are provided with a DC bias voltage from a 5 volt source via resistor 18 which may be a 40K resistor.

As will be explained further below, the manner in which the bias voltage is applied is changed when field effect transistor (FET) Q1 is turned on. However, before describing the operation of FET Q1 and its associated circuitry, the operation of FIG. 1 with Q1 off and not conducting will first be described.

As noted above, when processing tone signals in tone channel guard applications, the tone limiter 5 receives sine wave signals and generates square wave signals (which are thereafter processed by the transceiver microprocessor 20 which decodes the channel guard tones). Before describing the tone limiter 5 shown in FIG. 1, the operation of a simplified tone limiter will be first described in FIG. 3a.

The tone limiter in FIG. 3a is a high gain comparator 22. Here the comparator's reference voltage is 5 Vdc at the non-inverting (+) input. The FM detector 2 feeds the inverting (−) input. Any variance from the normal 5 Vdc on the detector's output will be amplified greatly. If the detector output swings a few millivolts less than 5 volts, the tone limiter output will saturate to a positive voltage.

When an on-frequency carrier is frequency modulated by a tone at 0.5 kHz deviation as represented in FIG. 3b, the limiter will produce a symmetrical square wave as in FIG. 3c. This square wave signal of the tone or data is sent to microprocessor 20 where it will be reliably decoded.

If the RF carrier frequency is, for example, 400 Hz low as in FIG. 3d, an unsymmetrical square wave, as shown in FIG. 3e, will be produced which cannot be decoded reliably under noisey conditions. If the carrier frequency error is greater than the 0.5 kHz deviation, as shown in FIG. 3f, no useful output will be produced from the limiter as shown in FIG. 3g.

Turning back to FIG. 1, the off-frequency carrier problem described above is obviated by blocking the FM detector's dc component with capacitor C1. The comparator's inverting input will always be at 5 volts with only the amplitude variations from the detector 2 passing to the limiter.

As noted above, active low pass filters 4 provide a 220 Hz cutoff to remove voice and noise signals before the limiter 5. Capacitor C1 serves to prevent the op amps in the active filters 4 from possible saturation with off-frequency signals. The filters 4 always receive a constant 5 volt dc bias.

When the active filters 4 are introduced into the tone processing path, the dc offsets in the op amps in 4 are amplified causing a slight error in the 5 volt dc bias on the filter's output (typically less than 100 mV). This offset will cause a similar symmetry problem as in FIG. 3d.

To solve this problem, the limiter's reference is derived from the dc voltage on the output of filters 4 as shown in FIG. 1. Resistor 8 and capacitor 10 filter all signal information to provide a smooth dc reference to the comparator. Resister 6 minimizes the dc offset of the comparator 12. Therefore, the inverting input of comparator 12 receives the tone signals from the filters 4 and the non-inverting input receives a dc reference equal to the inverting input.

Turning to the detailed operation of the tone limiter 5 with transistor Q1 off, the 5 volt bias potential is applied via resistor 18 to set the DC level for the tone limiter 5 and to provide the required bias voltage for the filters in block 4.

As noted above, with Q1 off when no carrier is present, the output of the FM detector 2 consists of noise at an average DC level. When the FM detector detects a signal from a transmitter which is on frequency with the receiver, the average DC level output by the FM detector does not change as shown in FIG. 2b. The appropriate DC bias voltage is then fed to tone limiter 5 which operates to generate valid data.

Tone limiter 5, as noted above, receives the output of the DC coupled filters and amplifiers 4 and includes a resistor 6 which may, for example, be a 22K resistor and which is coupled to the inverting input of tone limiter comparator 12. Also receiving the output of the DC coupled filters and amplifiers 4 is a resistor 8 (which may, for example, also be a 22K resistor) and which is coupled to the non-inverting input of the tone limiter comparator 12. Also coupled to the non-inverting input of comparator 12 is capacitor 10 which is also connected to ground and which operates as described above to provide a smooth DC reference to the comparator 12.

When an on-frequency carrier is detected by the FM detector 2, the DC level remains constant. With no shift in this DC level, the voltage at the inverting and non-inverting inputs of tone limiter comparator 12, likewise remains at a predetermined desired voltage e.g., 5 Volts.

If, for example, the DC level at the output of FM detector 10 rises to a predetermined voltage level, then the inverting input of tone limiter comparator 12 will correspondingly rise initially in voltage level to, for example, 6 volts before capacitor C1 charges through resistor 18. The non-inverting input, however. Will for a predetermined period of time remain at five volts due to the RC time constant of the 22K resistor 8 and the capacitance of capacitor 10 (which may, for example, be 10 $\mu$F). With the inverting input at 6 volts and the non-inverting input at 5 volts, the output of comparator 12 will go to a negative or low level.

If, alternatively, the output of the FM detector 2 falls from the above-mentioned average DC level to a lower DC level (due to a shift in carrier frequency), the inverting input of comparator 12 correspondingly drops initially to, for example, 4 volts. The positive input remains at 5 volts due to the aforementioned RC time constant. Thus, the output of tone limiter 5 will go initially to a positive voltage indicative of a logic 1 level.

As noted above, upon receipt of a predetermined sequence of logic 1's or 0's, the microprocessor 20 detects the presence of a predetermined tone pattern (if tone channel guard is being utilized) or a predetermined string of logic 1's or 0's (if digital channel guard is being utilized). Upon decoding such a pattern, microprocessor 20 closes a predetermined audio signal path in the transceiver by, for example, transmitting a signal to audio switch 22 to unmute the audio to thereby allow the transmitted audio to be heard in the receiver.

If the radio transceiver is being controlled by the microprocessor 20 to operate in a scanning mode, upon detection of such a correct tone pattern or data stream the scanning operation stops and the audio input is received. If the received tone pattern or data pattern does not reflect the predetermined sequence of 1's and 0's, then the scanning process continues.

If the transmitter is operating off frequency by, for example, 1 kHz the DC level output from the FM detector may shift from the desired dc level of 5 volts to, for example, 6 volts. As noted above, typical manufacturer specifications permit tone signals or digital data to frequency modulate an RF carrier at a minimum of plus or minus 0.5 kHz deviation.

Figure 4:
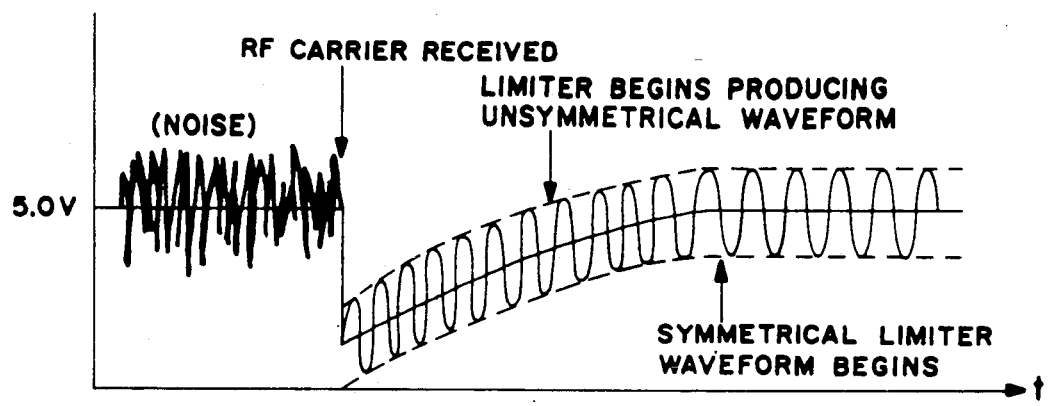
FIG. 4 is an exemplary waveform generated in the circuit of FIG. 1 after capacitor C1 when an off-frequency RF carrier is applied without turning on Q1.

Although, as described above, C1 allows the limiter 5 to provide useful data when the RF carrier is off-frequency, C1 must charge initially when the carrier appears. During this charging period, the tone limiter 5 is providing either no data or unsymmetrical data. FIG. 4 shows the waveform presented to the limiter after capacitor C1 when an off-frequency RF carrier is applied. The RC time constant must be long enough to preserve the data waveforms. Thus, during the time that it takes to charge capacitor C1 through resistor 18, the tone limiter 5 will generate invalid data.

In accordance with the present invention, a pulse is introduced into the receiver tone or data processing path which triggers a quicker settling time for the tone limiter 5 so that valid data will be produced as quickly as possible. In this regard, the pulse introduced into the path serves to turn on transistor Q1 which results in capacitor C1 being charged to a new DC level to reflect the shift in the DC level at the output of FM detector 2.

If the output of FM detector 2 is shifted to, for example, 6 volts due to the transmitter being off frequency by 1 kHz and the tone limiter 5 requires a 5 volt bias voltage, then capacitor C1 needs to be charged as rapidly as possible in order to control tone limiter 5 to generate valid data as rapidly as possible.

The pulse which triggers the initiation of a quicker tone limiter "settling" time is shown in FIG. 1 as being a 10 millisecond pulse which is input to the gate of FET Q1. The 10 millisecond pulse in the presently preferred embodiment is generated by the transceiver microprocessor 20 upon the detection of 1) a change in the receiver's channel frequency and 2) the activation of the carrier activity sensor (i.e., the noise squelch). The carrier activity sensor (CAS) circuit 24 becomes active when it detects a drop in the high frequency noise output from the FM detector 2 to indicate to transceiver microprocessor 20 that a RF signal is quieting the receiver. Thus, in one exemplary embodiment, in order to generate the 10 millisecond pulse, the transceiver microprocessor 20 is programmed to implement a logic "AND" function to generate the 10 millisecond pulse upon detecting that the receiver's channel frequency is changed while the carrier activity sensor is active.

It is emphasized, however, that the 10 millisecond pulse may be generated in accordance with the present invention, whenever the carrier activity sensor becomes active. In this regard, even when the receiver is not operating in a channel scanning mode, but rather is attempting to detect a correct channel guard sequence, generation of the 10 millisecond pulse will aid the receiver in detecting the channel guard sequence more rapidly. In this fashion, it may be possible to avoid delays in unmuting the audio which might cause the loss of a portion of a conversion, e.g., a syllable of a word.

The 10 millisecond pulse width generated by microprocessor 20 is of sufficient pulse width to insure that, even if the transmitter is as much as 5 kHz off frequency, there is sufficient time to charge capacitor C1 up to the large dc level shift due to the transmitter being off frequency. It is noted that the width of the pulse may be set to less than 10 milliseconds if the resistor 16 is reduced in value.

If the output of FM detector 2 is at 5 volts with no carrier present, then capacitor C1 has substantially 0 volts across it, presuming that the voltage on the opposite plate of capacitor C1 (which is to be coupled to the tone limiter 5) is likewise at 5 volts. If the output of FM detector 2 shifts to 6 volts due to an off frequency transmitter, then without transistor Q1 conducting, C1 must charge up to 1 volt through resistor 18. The time required for capacitor C1 to charge up to 1 volt is a function of the RC time constant of resistor 18 and capacitor C1. Until capacitor C1 charges up to the 1 volt level, the tone limiter 5 is unable to provide valid data.

Upon the generation of the 10 millisecond pulse at the gate of transistor Q1, transistor Q1 is turned on and begins to conduct. When transistor Q1 becomes conductive, 5 volts is then supplied via resistor 16. As a result, C1 charges through the essentially parallel combination of resistors 16 and 18. Thus, with resistor 18 having the value of 40K and resistor 16 having the value of 1K, capacitor C1 is able to charge up essentially 40 times faster than it could charge through resistor 18 alone.

As noted above, during the time period that it takes capacitor C1 to reflect the new DC level, any data output from tone limiter 5 is not valid data. Accordingly, by controlling capacitor C1 to charge to the required DC value 40 times faster, the operation of the tone data processing circuitry is significantly improved.

In the embodiment of FIG. 1, as noted above, the specific component values shown are not critical to the present invention. Resistor 16 should, however, have a much lower resistance than resistor 18. Additionally, resistor 6 should have a resistance equal to resistor 8 and the time constant of resistor 18 and C1 should be less than the time constant of resistor 8 and capacitor 10.

Since the 10 millisecond pulse is sufficient to rapidly charge capacitor C1 through the parallel combination of resistors 16 and 18 to the FM detector's new DC level, no significant timing degradation of tone or data decoding occurs. Tone limiter 5 produces valid digital data immediately after the 10 millisecond pulse. In this regard, capacitor C1, resistor 16 and FET Q1 have a low frequency cut-off of 60 Hz, and the tone limiter rapidly produces valid tone data (above 60 Hz) i.e., once capacitor C1 is charged during the pulse.

Figure 5:
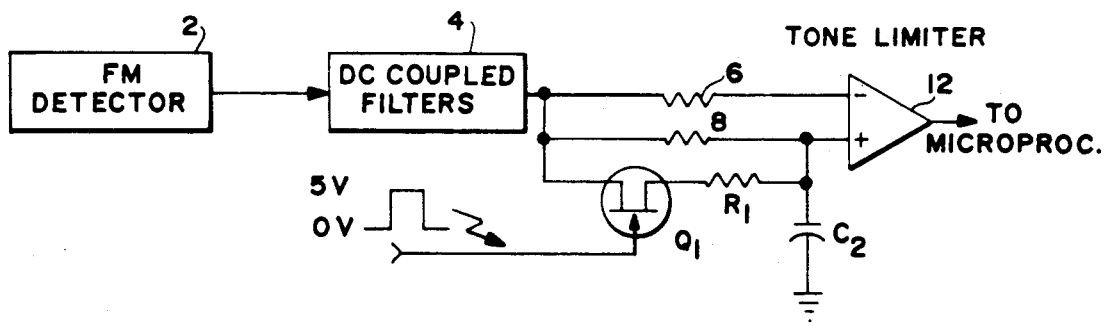
FIG. 5 is an alternative embodiment of tone data/processing circuitry in accordance with the present invention.

An alternative embodiment of a fast settling tone processing circuit of the present invention is shown in FIG. 5. This circuit (which does not use a capacitor C1, such as shown in FIG. 1) is similar to the circuit of FIG. 1 and will only be briefly described below. Similarly labelled components operate identically in FIGS. 1 and 5. In FIG. 5, resistor 6 has a resistance equal to resistor 8 and resistor R1 has a resistance much less than resistor 8.

In FIG. 5, the FM detector level must be low enough so the filters 4 and limiter 12 can still function properly without saturating when the RF carrier is off frequency. The filter output must have a low impedance to source the charging current of C2 through Q1 during the 10 millisecond pulse applied to Q1. Therefore, when an off-frequency carrier appears, C2 is charged quickly so the dc reference to the comparator will equal the dc level on the inverting signal input. This circuit will operate well if the filters 4 and limiter 12 can operate over a wide dc bias range determined by the FM detector output.

The present invention may be advantageously utilized in radios which allow searching of priority channels while listing to an active channel. In this regard, it is noted that checking a priority channel for carrier activity and correct tones or data may place a gap in the active channel's audio. Thus, a slow scanning rate can cause long holes to actually delete words in the conversation. In this regard, when the receiver changes its channel frequency to check the priority channel frequency for carrier activity, the audio of the active channel is muted while the carrier activity on a priority channel is being sensed. If nothing is detected or if a detected channel guard is not valid, the conversation on the active channel is returned to. However, prior to the present invention a significant time period was involved in staying at the priority channel long enough to insure that the tone processing circuit had enough time to decode valid data. By virtue of the generation of the 10 millisecond pulse in the manner described above, no significant timing degradation of tone or data decoding occurs.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. In a radio having an FM detector for receiving predetermined audio signals and a predetermined pattern of tones or digital data, a fast settling tone, data processing circuit comprising:

processing means for receiving a pattern of tones or digital data from said FM detector and for generating radio enabling data; and bias voltage control means coupled to the output of said FM detector and to said processing means for providing a bias voltage to said processing means and including means responsive to the detection of an RF carrier for initiating a high speed generation of the bias voltage required for the processing means to enable the processing means to rapidly generate valid radio enabling data, whereby a predetermined pattern of valid enabling data may be detected to enable the predetermined audio signals to be heard.

2. A circuit according to claim 1, wherein said bias voltage control means includes means for permitting valid data to be generated by said processing means even when the FM detector detects an off-frequency carrier.

3. A circuit according to claim 2, wherein said means for permitting valid data to be generated includes a direct current (dc) blocking capacitor coupled to receive the output of said FM detector.

4. A circuit according to claim 1 wherein said bias voltage control means includes a capacitor coupled to receive the output from said FM detector and wherein said means for initiating high speed generation of the bias voltage includes means for rapidly charging said capacitor in response to the detection of an RF carrier.

5. A circuit according to claim 1, wherein said means for initiating the high speed generation of the bias voltage includes means for generating a predetermined pulse whenever an RF carrier is detected; and
  switching means responsive to said predetermined pulse to initiate said high speed generation of the bias voltage.

6. A circuit according to claim 5, wherein said means for generating said predetermined pulse includes a microprocessor.

7. A circuit according to claim 6, wherein said microprocessor includes means for decoding the radio enabling data generated by said processing means.

8. A circuit according to claim 1, wherein said bias voltage control means includes a capacitor coupled to a supply voltage via a first resistor; and
  wherein said means for initiating a high speed generation of the bias voltage includes a second resistor, and switching means responsive to the detection of an RF carrier for coupling the first resistor and second resistor so as to rapidly charge said capacitor.

9. A circuit according to claim 8, further including means responsive to a drop in the high frequency noise output from the FM detector to generate a predetermined pulse; and
  wherein said switching means is responsive to said predetermined pulse.

10. A circuit according to claim 5, wherein said predetermined pulses has a pulse width on the order of 10 milliseconds.

11. A circuit according to claim 1, wherein said processing means includes:
  filter means coupled to said FM detector for passing low frequency signals and for significantly attenuating high frequency signals; and
  tone limiter means for receiving tone or digital data signals from said filter means and for generating digital signals indicative thereof.

12. A circuit according to claim 11 wherein said tone limiter includes a voltage comparator having an inverting input and a non-inverting input;
  a first resistor coupled to the output of said filter means and the inverting input of said voltage comparator;
  a second resistor being to the output of said filter means and the non-inverting input of said voltage comparator.

13. A circuit according to claim 12 wherein a capacitor is also coupled to the non-inverting input of the voltage comparator.

14. In a radio receiver having an FM detector for receiving predetermined audio signals and a predetermined pattern of tones or digital data and means for decoding said predetermined pattern to enable said predetermined audio signals to be heard, a fast settling tone/data processing circuit comprising:
  means for processing a pattern of tones or digital data to generate data for enabling the predetermined audio signals to be heard in the receiver and for coupling said data to said means for decoding;
  means coupled to said FM detector and to said means for processing for preventing a received off-frequency carrier from causing said means for processing to generate unreliable data; and
  means, coupled to said means for preventing and responsive to an indication that a pattern of tones or digital data must be decoded, for initiating a high speed operation of said means for preventing.

15. A circuit according to claim 14, wherein said means for preventing comprises a capacitor coupled to receive the output from said FM detector.

16. A circuit according to claim 15 further including first means for charging said capacitor.

17. A circuit according to claim 16, wherein said first means for charging includes a voltage source and first resistor.

18. A circuit according to claim 17, wherein said means for initiating high speed operation of said means for preventing includes means for rapidly charging said capacitor in response to the detection of an RF carrier or the changing of the receiver's channel frequency.

19. A circuit according to claim 18, wherein said means for rapidly charging includes means for generating a predetermined pulse; and
  switching means responsive to said predetermined pulse to initiate said rapid charging of said capacitor.

20. A circuit according to claim 19, wherein said means for rapidly charging includes a second resistor, and wherein said switching means upon receiving said predetermined pulse being operable to couple said first and second resistor to rapidly charge said capacitor.

21. A circuit according to claim 14, wherein said means for processing includes:
  filter means coupled to said FM detector for passing low frequency signals and for significantly attenuating high frequency signals; and
  tone limiter means for receiving tone or digital data signals from said filter means and for generating digital signals indicative thereof.

22. A circuit according to claim 21, wherein said tone limiter includes a voltage comparator having an inverting input and a non-inverting input;
  a first resistor coupled to the output of said filter means and the inverting input of said voltage comparator;
  a second resistor being to the output of said filter means and the non-inverting input of said voltage comparator.

23. A circuit according to claim 22, wherein a capacitor is also coupled to the non-inverting input of the voltage comparator.

24. In a radio receiver having an FM detector for receiving predetermined audio signals and a pattern of tones or digital data and tone processing means for processing said pattern and for generating data indicative thereof for enabling the predetermined audio signals to be heard, a method for rapidly settling the tone processing means comprising the steps of:
  preventing an off-frequency carrier from causing invalid data to be generated by said tone processing means by disposing a dc blocking capacitor between the FM detector and said tone processing means; and
  rapidly charging said dc blocking capacitor in response to at least one of the sensing of a RF carrier or the changing of the receiver channel frequency to rapidly settle the tone processing means.

25. A method according to claim 24, wherein said rapidly charging step includes the steps of generating a pulse whenever an RF carrier is detected, and applying said pulse to a switching means coupled to said dc blocking capacitor.

26. A method according to claim 25, further including the step of coupling a pair of resistors in parallel in response to the application of the pulse to the switching means to thereby rapidly charge said capacitor.

27. A method according to 25, wherein said radio includes a transceiver microprocessor which decodes the data generated by said tone processing means, said method further including the step of generating said pulse with said transceiver microprocessor.

28. In a radio having an FM detector for receiving a predetermined pattern of tones or digital data, a fast settling tone, data processing circuit comprising:
   processing means for receiving and processing a predetermined pattern of tones or digital data from said FM detector; and
   bias voltage control means coupled to the output of said FM detector and to said processing means for providing a bias voltage to said processing means, said control means including means responsive to the detection of an RF carrier for initiating a high speed generation of the bias voltage required for the processing means to generate valid data, whereby a predetermined pattern of valid data may be detected.

29. A circuit according to claim 28, wherein said bias voltage control means includes means for permitting valid data to be generated by said processing means even when the FM detector detects an off-frequency carrier.

30. A circuit according to claim 29, wherein said means for permitting valid data to be generated includes a direct current (dc) blocking capacitor coupled to receive the output of said FM detector.

31. A circuit according to claim 28, wherein said bias voltage control means includes a capacitor coupled to receive the output from said FM detector and wherein said means for initiating high speed generation of the bias voltage includes means for rapidly charging said capacitor in response to the detection of an RF carrier.

32. A circuit according to claim 28, wherein said means for initiating the high speed generation of the bias voltage includes means for generating a predetermined pulse whenever an RF carrier is detected; and
   switching means responsive to said predetermined pulse to initiate said high speed generation of the bias voltage.

33. A circuit according to claim 32, wherein said means for generating said predetermined pulse includes a microprocessor.

34. A circuit according to claim 33, wherein said microprocessor includes means for decoding the processed data generated by said processing means.

35. A circuit according to claim 28, wherein said bias voltage control means includes a capacitor coupled to a supply voltage via a first resistor; and
   wherein said means for initiating high speed generation of the bias voltage includes a second resistor, and switching means responsive to the detection of an RF carrier for coupling the first resistor and second resistor so as to rapidly charge said capacitor.

36. A circuit according to claim 35, further including means responsive to a drop in the high frequency noise output from the FM detector to generate a predetermined pulse; and
   wherein said switching means is responsive to said predetermined pulse.

37. In a radio receiver having an FM detector for receiving a predetermined pattern of tones or digital data and means for decoding said predetermined pattern, a fast settling tone/data processing circuit comprising:
   means for processing a predetermined pattern of tones or digital data to generate data and for coupling said data to said means for decoding;
   means coupled to said FM detector and to said means for processing for preventing a received off-frequency carrier from causing said means for processing to generate unreliable data; and
   means, coupled to said means for preventing and responsive to an indication that a predetermined pattern of tones or digital data must be decoded, for initiating a high speed operation of said means for preventing.

38. A circuit according to claim 37, wherein said means for preventing comprises a capacitor coupled to receive the output from said FM detector.

39. A circuit according to claim 38 further including first means for charging said capacitor.

40. A circuit according to claim 39, wherein said first means for charging includes a voltage source and first resistor.

41. A circuit according to claim 40, wherein said means for initiating high speed operation of said means for preventing includes means for rapidly charging said capacitor in response to the detection of an RF carrier or the changing of the receiver's channel frequency.

42. A circuit according to claim 41, wherein said means for rapidly charging includes means for generating a predetermined pulse; and
   switching means responsive to said predetermined pulse to initiate said rapid charging of said capacitor.

43. A circuit according to claim 41, wherein said means for rapidly charging includes a second resistor, and wherein said switching means upon receiving said predetermined pulse being operable to couple said first and second resistor to rapidly charge said capacitor.

44. In a radio receiver having an FM detector for receiving a predetermined pattern of tones or digital data and tone processing means for processing said pattern and for generating data indicative thereof, a method for rapidly settling the tone processing means comprising the steps of:
   preventing an off-frequency carrier from causing invalid data to be generated by said tone processing means by disposing a dc blocking capacitor between the FM detector and said tone processing means; and
   rapidly charging said dc blocking capacitor in response to at least one of the sensing of a RF carrier or the changing of the receiver channel frequency to rapidly settle the tone processing means.

45. A method according to claim 44, wherein said rapidly charging step includes the steps of generating a pulse whenever an RF carrier is detected, and applying said pulse to a switching means coupled to said dc blocking capacitor.

46. A method according to claim 45 further including the step of coupling a pair of resistors in parallel in response to said application of the pulse to the switching means to rapidly charge said capacitor.

47. A method according to 45, further including the steps of decoding the data generated by said tone processing means using a transceiver microprocessor, and generating said pulse with said transceiver microprocessor.

* * * * *